United States Patent
Pascucci

[19]

[11] Patent Number: 5,959,935
[45] Date of Patent: Sep. 28, 1999

[54] SYNCHRONIZATION SIGNAL GENERATION CIRCUIT AND METHOD

[75] Inventor: Luigi Pascucci, Sesto San Giovanni, Italy

[73] Assignee: SGS-Thomson Microelectronics S.r.l., Agrate Brianza, Italy

[21] Appl. No.: 08/865,748

[22] Filed: May 30, 1997

[51] Int. Cl.$^6$ .................................. G11C 8/00; G11C 7/00
[52] U.S. Cl. ................ 365/233; 365/233.5; 365/189.09; 365/189.11; 365/194
[58] Field of Search ................................ 365/233, 233.5, 365/189.11, 194, 189.09, 226

[56] References Cited

U.S. PATENT DOCUMENTS

| | | | |
|---|---|---|---|
| 4,811,299 | 3/1989 | Miyazawa et al. | 365/233 |
| 5,177,393 | 1/1993 | Miyazawa et al. | 365/233 |
| 5,473,574 | 12/1995 | Clemen et al. | 365/233 |
| 5,532,972 | 7/1996 | Passcucci et al. | 365/233 |
| 5,663,921 | 9/1997 | Passcucci et al. | 365/233 |

*Primary Examiner*—Trong Phan
*Attorney, Agent, or Firm*—David V. Carlson; Seed and Berry LLP

[57] ABSTRACT

The invention refers to a generating circuit for synchronization signals to regulate the read phase of memory cells in electronic devices with an integrated memory on a semiconductor, of the type controlled by a switching of logical states on a left ATD bus and a right ATD bus and comprising a left and a right section inserted between a first and a second voltage reference and connected respectively to the left and the right ATD bus, the sections being connected at the input to a reference-voltage generated and at the output to an ATD generator. Each of the sections of the generating circuit according to the invention includes a pull-up transistor inserted between the first voltage reference and a first internal circuit node and having a control terminal connected to a polarization structure suitable for modifying the conductivity of pull-up transistors, intentionally reduced in the coupling phase to assure capture of all transitions on the left and right ATD buses, and increased in the operating phase to follow with precision the events of the transition, guiding the read phase in a timely manner.

20 Claims, 3 Drawing Sheets

SYNCHRONIZATION SIGNAL GENERATION CIRCUIT AND METHOD

TECHNICAL FIELD

This invention relates to a synchronization-signal generation circuit to regulate the read phase of memory cells in electronic devices with an integrated memory on a semiconductor of the type controlled by a logical-state switch on a left ATD bus and a right ATD bus. The synchronization-signal generation circuit includes a left and a right section inserted between a first and a second voltage reference and connected, respectively, to said left and right ATD buses, said sections being connected at the input to a reference-voltage generator and at the output to an ATD generator.

As is well known, the method of reading the contents of the cell of an electronic circuit with an integrated memory on a semiconductor is made possible by a predetermined sequence of operations known in the technical jargon as a read cycle.

A read cycle starts when the address in memory of a data element to be read is presented to the input terminals of the memory circuit. An input stage detects the change in the addresses present on these terminals, thus effecting a read operation.

Row- and column-decoding circuits select the memory word that has been addressed.

The states of the cells contained in this memory word are identified by means of a read amplifier called a sense amplifier. The data element detected by the sense amplifier is then presented at the output by means of an output-buffer stage.

BACKGROUND OF THE INVENTION

All of the read-cycle phases mentioned previously should have a duration that is predefined and compatible with the memory-access times provided by the specifics of the memory circuit.

All the various phases of the read cycle are scanned by synchronization pulses deriving from a single main pulse called ATD (address transition detection). The ATD pulse is generated within the memory circuit whenever a change in the address is detected at its input terminals.

Generation of the ATD pulse is generally requested by a logical NOR network, which normally has an output at the high logic level.

When a change in the logic level occurs, even on only one of the input terminals, the logical NOR network changes the output itself, permitting a terminal that has been sampled by the ATD pulse to discharge to ground.

In reality, there are many logical networks that permit realization of an ATD pulse generating circuit.

A first example of such an ATD pulse generating circuit includes the use of transistors of the CMOS type. In this case, very complex logic networks are obtained, and, given the high number of addresses to be detected that are normally contained in a memory, a tree organization of the network used is made necessary, i.e., a structure including many levels.

Logical networks made in this way are called "full CMOS" in technical language, and they permit the generation of very narrow and rapid ATD pulses.

However, the principal disadvantage of full-CMOS networks consists of the presence of intrinsic delays due to the various logic levels of the tree structure used and to the consistent obstacles arising from the complexity of the network itself, for example from the presence of PMOS and NMOS transistors at every point monitored by all the subsequent level structures.

Alternatively, it is possible to realize an ATD pulse generating circuit by means of MOS transistors with an N channel, or NMOS. Networks simpler than full-CMOS networks are obtained in this manner, which are called "NMOS" networks and are arranged basically according to an OR configuration using a single pull-up transistor.

Such a pull-up transistor has only one control-gate terminal connected to a ground voltage reference, and therefore a higher resistance to guarantee a low threshold level for switching on the transistor that is less than a Vtp value equal to the threshold voltage of a PMOS transistor, even in the presence of high voltages. The ATD pulse line obtained in this manner is detected in the very capacitative realizations that produce rapid ATD pulses on a first switching leading edge of an input signal but very slow on a second switching leading edge. This slowness is caused by the charge resistivity and the capacitance of the line.

In particular, this second switching leading edge turns out to be strongly dependent on the process parameters, on the operating conditions, on the operating temperature, and on the entire context of operation of the network. Disadvantageously, however, an ATD signal of a non-pulse type is obtained by means of such "NMOS" networks, depending on the parameters of the network. Moreover, "NMOS" networks also absorb current as they operate, because of the presence of the resistive pull-up transistor.

It is possible to obtain, starting from an "NMOS" network, an ATD pulse generating circuit with much faster dynamics, that is, with rapid switching on both its leading edges, but with the addition of particular consolidations that increase the complexity of the network.

SUMMARY OF THE INVENTION

In an embodiment of the present invention, a symmetric structure including a pair of pull-up transistors with suitably modulated conductivity is utilized.

According to the principles of the present invention, an ATD pulse generating circuit with structural characteristics and functions that overcome the inconveniences that have so far afflicted circuits realized according to the state of the art has been devised.

In particular, an embodiment of the present invention is directed to an ATD pulse generating circuit without having a "full CMOS" configuration in all its parts and permits all memory-address transitions to be detected at its input terminals in such a manner that:

they are secure in their function of "capturing" the transition of a generic address at an input terminal:

they produce rapid pulses with substantially symmetrical leading edges.

The characteristics and advantages of the circuit according to the invention appear in the following description of an embodiment, which is given in an indicative and nonlimiting manner, with reference to the attached diagrams.

DETAILED DESCRIPTION OF THE INVENTION

Figure 1:
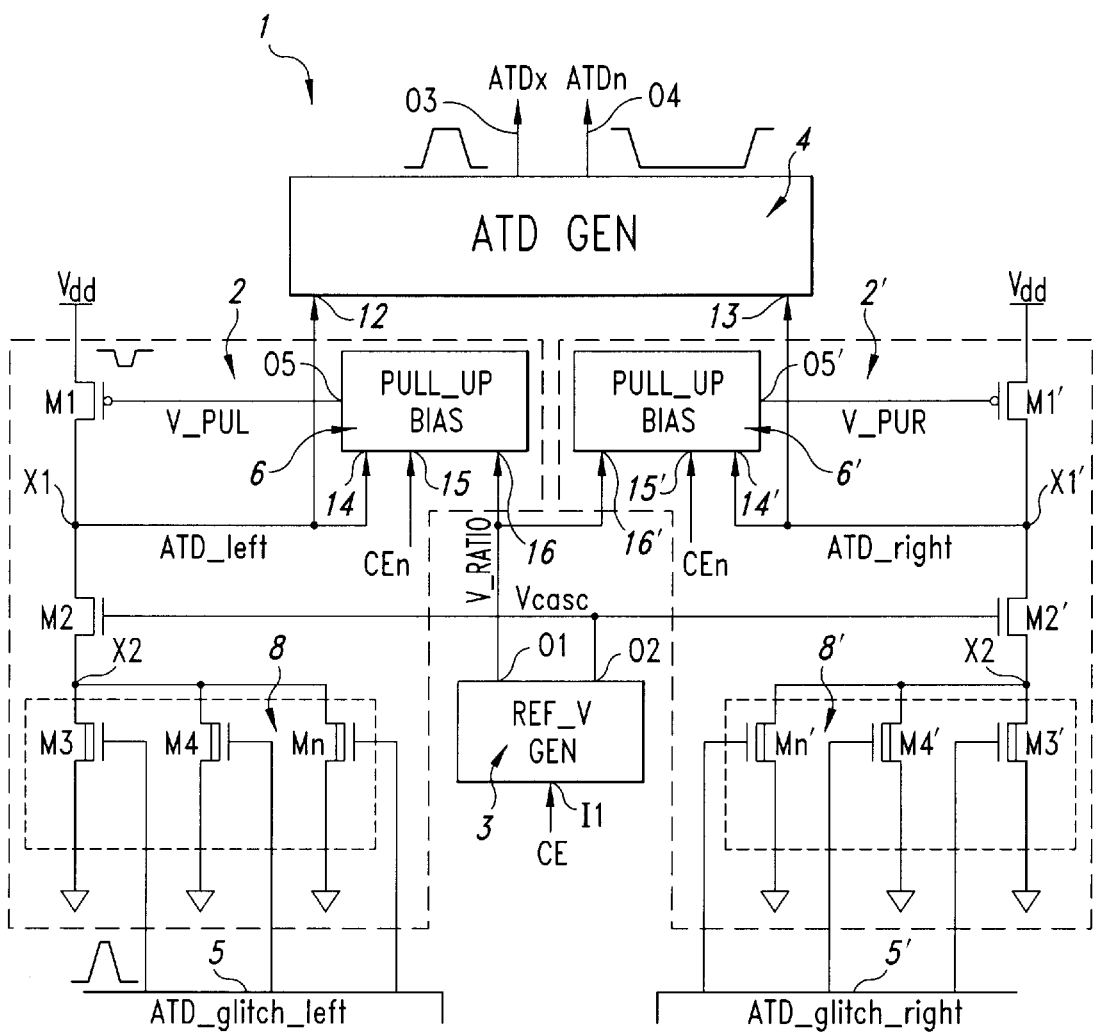
FIG. 1 shows a schematic view of an ATD pulse generating circuit according to the invention.
Figure 2:
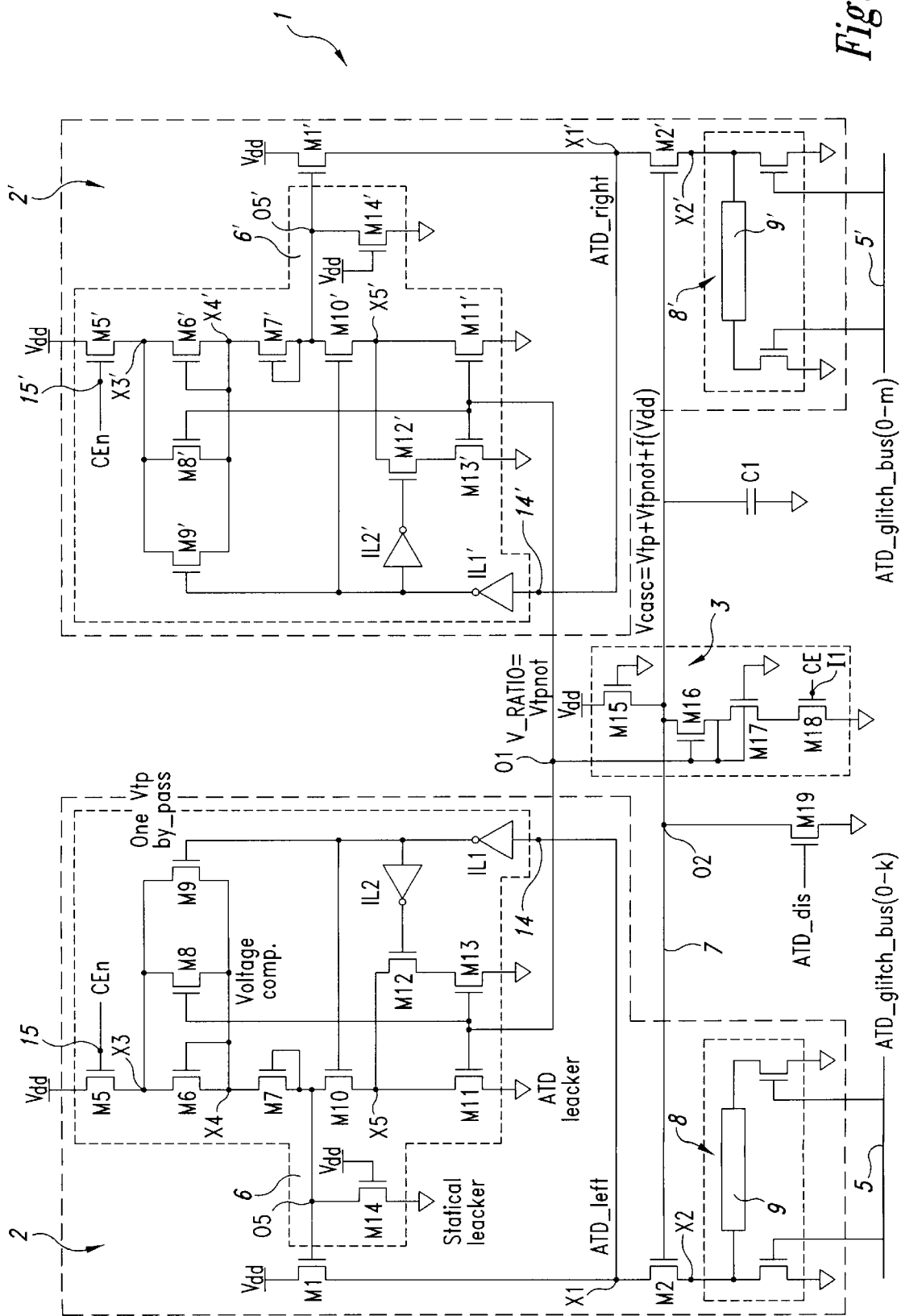
FIG. 2 shows the ATD pulse generating circuit of FIG. 1 in greater structural detail.

With reference to these figures, a circuit 1 for generating an ATD (Address Transition Detection) pulse according to the invention, for use during a read cycle of a memory cell, is shown in FIGS. 1 and 2.

Memory is understood to be a conventional integrated electronic device on a semiconductor, structured with a matrix of memory cells organized in rows and columns. Associated with the matrix are corresponding circuit portions for decoding rows and columns, as well as reading amplifiers.

The memory cells can be of any kind; however, for purposes of the present invention, they are preferably of the nonvolatile flash EEPROM type with the possibility of electric programming and erasing.

To better understand the aspects of the present invention, it is good to recall that the read phase of this memory cell envisions a cycle of operations scanned by synchronization pulses deriving from a single principal pulse called ATD.

Circuit 1, which generates the ATD pulse, comprises a left section (2) and a right section (2'), structurally identical with each other and inserted between a first supply-voltage reference, (Vdd) and a second supply reference, in particular a ground signal (GND).

Sections 2 and 2' are also connected at the input to a reference-voltage generator (3) and at the output to an ATD generator (4), as well as to a left ATD bus (5) and to a right ATD bus (5'), respectively.

The reference-voltage generator (3) has an input terminal (I1), which receives an enabling signal (CE) as well as first (O1) and a second (O2) output terminal, which provide a reference voltage (V_RATIO) and a cascode voltage (Vcasc) respectively, and are connected to the left (2) and right (2') sections of the ATD pulse generating circuit (1).

The ATD generator (4) has a first (I2) and a second (I3) input terminal, connected respectively to the left (2) and the right (2') section of the ATD pulse generating circuit (1), as well as a first (O3) and a second (O4) output terminal, which respectively provide a pulse signal (ATDX) and a negative signal (ATDn), the duration of the signals present at the second output terminal (O4) also being increased.

Advantageously, according to the invention, signal ATDn is a signal that can be assimilated to a clock signal of a predetermined duration.

We shall now see in more detail the organization of the left section (2) of the ATD pulse generating circuit (1), which is, moreover, identical to the right section (2').

Section 2 includes a pull-up transistor (M1), inserted between the supply-voltage reference (Vdd) and a first internal circuit node (X1) and having a polarization (6) suitable for modulating the conductivity of the pull-up transistor (M1), intentionally reducing it in the coupling phase to assure the capture of all transitions on the left ATD bus (5) and increasing it in the operating phase to follow with precision the events of the transition, guiding the read phase in a timely manner.

The polarization structure (6) has a first input terminal (I4) connected to the first internal circuit node (X1) at which a left trigger voltage (ATD_left) is present, a second input terminal (I5), which receives an enabling signal (CEn), which is the inverse of the enabling signal (CE) of the reference-voltage generator (3), a third input terminal (I6) connected to the first output terminal (O1) of the reference-voltage generator (3), receiving reference voltage V_RATIO, as well as an output terminal (O5), which provides a polarization voltage (V_PUL) and is connected to the control terminal of the pull-up transistor (M1) to modulate the conductivity.

Section 2 also includes a cascode transistor (M2), inserted between the first internal circuit node (X1) and a second internal circuit node (X2) and having a control terminal connected to a cascode line (7), on which the cascode voltage (Vcasc) is present.

Finally, section 2 includes an excitation structure (8), inserted between the second internal circuit node (X2) and ground (GND) and including several excitation transistors (M3, M4, . . . Mn) inserted, in parallel to one another, between node X2 and ground (GND) and having the control terminals connected to the left ATD bus (5).

Advantageously according to the invention, the cascode voltage (Vcasc) has suitably limited deviations to interrupt the connection to the excitation structure (8), which is strongly capacitative.

For brevity, a detailed description of the right section (2'), in which identical elements are indicated by the same reference numbers with the addition of an apostrophe, is omitted.

Specifically, the right section (2') includes a pull-up transistor (M1') inserted between the supply-voltage reference (Vdd) and a first internal circuit node (X1'), at which a trigger voltage (ATD_right) is present, and having a control terminal connected to an output terminal (O5') of a polarization structure (6'), which provides a polarization voltage (V_PUR).

In the embodiment illustrated in FIG. 1, the pull-up transistor (M1) is a transistor with a P channel or PMOS, the cascode transistor (M2) is a transistor with an N channel or NMOS, and the excitation transistors (M3, M4, . . . Mn) are NMOS transistors of the natural or native type.

Figure 3:
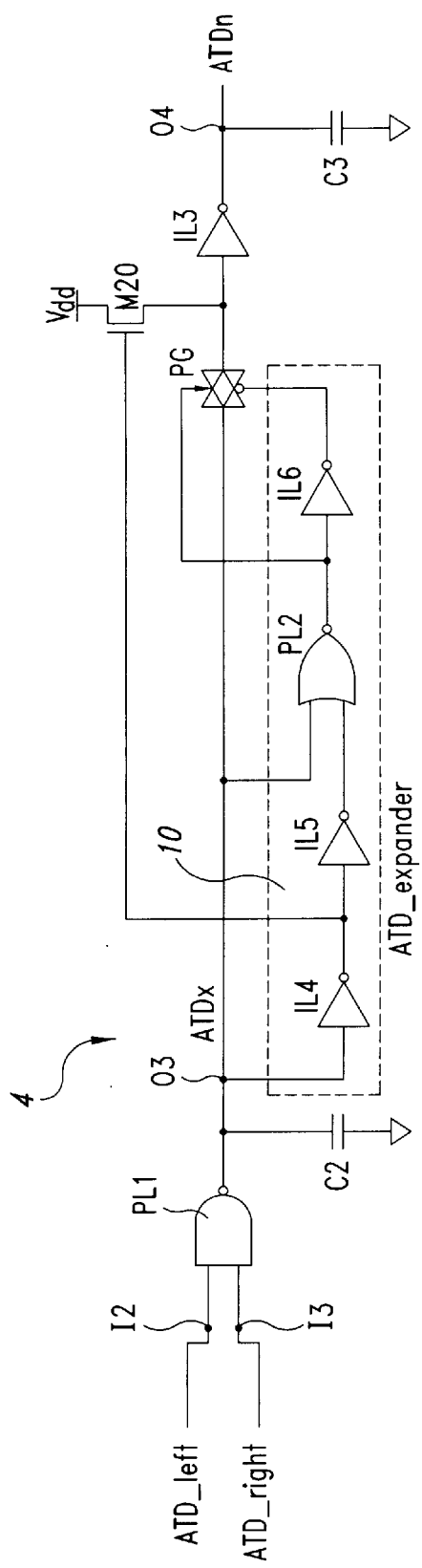
FIG. 3 shows a detail of the ATD pulse generating circuit of FIG. 1.

With particular reference to FIGS. 2 and 3, the circuit parts of the ATD pulse generating circuit (1) will now be illustrated in greater structural detail.

In order not to burden the description of the invention, reference will again be made only to the left section (2), with similar considerations applying to the right section (2').

The excitation structure (8) illustrated in FIG. 2 has a pair of decoupling transistors, connected to each other by an equivalent resistor (9), which is representative of the resistance of all the excitation transistors (M3, M4, . . . , Mn) of FIG. 1.

The polarization structure (6) includes an enabling transistor (M5), inserted between the supply-voltage reference (Vdd) and a third internal circuit node (X3), a first decoupling transistor (M6), configured as a diode and inserted between the third internal circuit node (X3) and a fourth internal circuit node (X4), and a second decoupling transistor (M7), which is also configured as a diode and inserted between the fourth internal circuit node (X4) and the output terminal (O5) of the polarization structure (6).

The polarization structure (6) also includes a first (M8) and a second (M9) by-pass transistor, inserted in parallel to each other between the third (X3) and the fourth (X4) internal circuit node and having its control terminals connected respectively to the third (I6) and the first (I4) input terminals of the polarization structure (6) by means of a first logical inverter (IL1).

Advantageously, according to the invention, the first by-pass transistor (M8) has a modulated impedance value, specifically greater at high voltages, so as to compensate for the greater voltage drop on transistor (M6) due to the increase in the branch current (e), and receives at its control terminal the reference voltage (V_RATIO), which is conveniently less than the cascode voltage (Vcasc), which keeps it turned on, and behaves like a voltage comparator, while the second by-pass transistor (M9), initially turned off, acts by eliminating a value equal to the threshold voltage (Vtp) of transistor (M6) during the rest phase, but permitting the value (Vtp) to increase during the active phase of the pulse, so as to increase the conductivity of transistor (M1) and to improve the output transition of node (X1) at the end of the pulse.

The polarization structure (6) also includes a first polarization transistor (M10) inserted between the output terminal (O5) and a fifth internal circuit node (X5) and having its control terminal connected to the first input terminal (I4) of the polarization structure (6) by means of the first logical inverter (IL1), as well as a second polarization transistor (M11) inserted between the fifth internal circuit node (X5) and ground (GND) and having its control terminal connected to the third input terminal (I6) of the polarization structure (6).

The first (M10) and second (M11) polarization transistors bring the control terminal of the pull-up transistor (M1) rapidly to a low logic level or level 0 in the presence of a level 0 on trigger signal ATD_left. In addition, the first logical inverter (IL1) has a suitably low tripping threshold, so as to assure descent of the trigger signal ATD_left before activation of the path through the first (M10) and the second (M11) polarization transistors.

The fifth internal circuit node (X5) is also connected to ground (GND) through the series from a first (M12) and a second (M13) connection transistor having their control terminals connected respectively to the first input terminal (I4) of the polarization structure (6), by means of a second logical inverter (IL2) and the first logical inverter (IL1) and to the third input terminal (I6) of the polarization structure (6).

Advantageously, according to the invention, the polarization structure (6) includes lastly a leakage transistor (M14) inserted between the output terminal (O5) and ground (GND) and having its control terminal connected to the supply-voltage reference (Vdd). The leakage transistor (M14) is conveniently resistive to establish a small current flow that polarizes the control terminal of the pull-up transistor (M1).

Moreover, the first decoupling transistor (M6) of the polarization structure (6) is connected to the first by-pass transistor (M8), which attenuates its voltage drop to the high voltages, thus decreasing the current drawn by the leakage transistor (M14) and therefore the current passing through pull-up transistor (M1).

The reference-voltage generator (3) includes a load transistor (M15), a first (M16) and a second (M17) polarization transistor and an enabling transistor (M18) inserted in series with each other between the supply-voltage reference (Vdd) and ground (GND).

In particular, the load transistor (M15) is inserted between the supply-voltage reference (Vdd) and the cascode line (7) and has a control terminal connected to ground (GND).

In addition, the first polarization transistor (M16) is configured as a diode and has its control terminal connected to the bulk terminal of the second polarization transistor (M17), having in turn its control terminal connected to ground (GND).

Finally, the enabling transistor (M18) receives the enabling signal (CE) at its control terminal, which is connected to the input terminal (I1) of the reference-voltage generator (3).

Advantageously, according to the invention, the ATD pulse generating circuit (1) includes a global enabling transistor (M19) inserted between the cascode line (7) and ground (GND) and receiving at its control terminal a global enabling signal (ATD_dis) from the ATD pulse generating circuit (1), as well as a compensation capacitor (C1), inserted between the cascode line (7) and ground (GND).

In the embodiment illustrated in FIG. 2, the enabling transistor (M5), the first (M6) and the second (M7) decoupling transistors, as well as the first (M8) and the second (M9) by-pass transistors of the polarization structure (6) are PMOS transistors, while the first (M10) and the second (M11) polarization transistors, the first (M12) and the second (M13) connection transistors, as well as the leakage transistor (M14) of the polarization structure (6) are NMOS transistors.

Moreover, the lead transistor (M15), the first (M16) and the second (M17) polarization transistors of the reference-voltage generator (3) are PMOS transistors, while the enabling transistor (M18) of the reference-voltage generator (3) is an NMOS transistor. Specifically, the second polarization transistor (M17) is of the native type.

Finally, the global enabling transistor (M19) is an NMOS transistor. It receives ATD-dis signal.

FIG. 3, shows in detail, the ATD generator (4), which receives the trigger signals ATD_left and ATD_right, respectively, at the first (I2) and second (I3) input terminal and provides the signals ATDx and ATDn, respectively, at its first (O3) and second (O4) output terminals.

The ATD generator (4) includes a logical input gate (PL1) inserted between the input terminals (I2 and I3) and the first output terminal (O3), connected in turn to ground (GND) through an input-load capacitor (C2) and to the second output terminal (O4) by means of a delay line (10), in series to a transistor (PG) of the CMOS pass-gate type and to a logical output inverter (IL3).

The delay line (10) includes a first logical-delay inverter (IL4) connected to the first output terminal (O3) and to a second logical-delay inverter (IL5), as well as to the control terminal of a decoupling transistor (M20) inserted between the supply-voltage reference (Vdd) and the CMOS pass-gate (PG).

The delay line (10) also includes a delay logic gate (PL2) that has a first input terminal connected to the second delay logical inverter (IL5), and second input terminal connected to the pass-gate CMOS (PG), and an output terminal connected to a third delay logical inverter (IL6) and to the pass-gate CMOS (PG)

The delay line (10) is advantageously of the asymmetric type, transmitting instantaneously the change from a logic level 0 to a logic level 1 of the pulse signal ATDx present at the first output terminal (O3) and, with a delay, the change from logic level 1 to logic level 0 of the same signal ATDx.

Advantageously, according to the invention, the ATD generator (4) includes an uncoupling output capacitor (C3), inserted between its second output terminal (O4) and ground (GND).

In the embodiment illustrated in FIG. 3, the decoupling transistor (M20) of the ATD generator (4) is a PMOS transistor. Moreover, the logical input gate (PL1) is a logic gate of the NAND type, while the logical-delay gate (PL2) is a logic gate of the NOR type.

Figure 4:
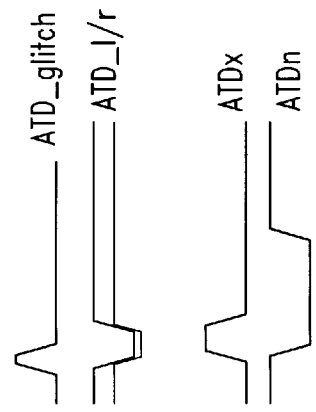
FIG. 4 shows the progression over time on the same time scale of signals present in the ATD pulse generating circuit of FIG. 1.

The progression of the signals on the left (5) and right (5') buses, as well as that of the trigger signals ATD_left and ATD_right, are shown in FIG. 4, together with the signals ATDx and ATDn generated respectively at the first (O3) and second (O4) output terminals of the ATD generator (4).

As will be seen in this diagram, signal the ATDx has a pulse character and is synchronized with the change in the trigger signals ATD_left and ATD_right, which are correlated in turn with the signal switching on buses 5 and 5', while the negative signal ATDn has a delayed switching on a descending leading edge of the trigger signals ATD_left and ATD_right, therefore taking on a progression of the clock type.

We shall now see the operation of the ATD pulse generating circuit according to the invention.

When the enabling signal (CE) is at a high logic level or level 1, the reference-voltage generator (3) is enabled and provides at the second output terminal (O2) a cascode voltage (Vcasc) equal to the sum of the threshold voltages (Vtp and Vtpnat) of the first (M16) and second (M17) polarization transistors, that is, of a PMOS transistor and a native PMOS transistor, which is added in turn to a function f(Vdd) of the supply voltage (Vdd) by means of the load transistor (M15).

The deviation of the voltage at the second circuit node (X2) is limited by the action of the cascode transistor (M2), through which this node is connected to the cascode line (7). In this way, the supply to the excitation structure (8) is interrupted advantageously, which, including several NMOS transistors connected by a suitable line, is necessarily characterized by a significant increase and is highly capacitive.

The reference-voltage generator (3) also provides a reference voltage (V_RATIO), that is less than the cascode voltage (Vcasc) of the threshold value (Vtp) of a PMOS transistor and is therefore in a position to keep the first by-pass transistor (M8) of the polarization structure (6) turned on.

The leakage transistor (M14) is very resistive and establishes a small current flow that polarizes the control terminal of the pull-up transistor (M1) at a value of Vdd−2Vtp+f(I (M14)), where f(I(M14) is a value depending on the current in the leakage transistor (M14).

Under conditions of rest, trigger signal ATD_left is at level 1. A low logic level, or level 0, is then applied by means of the first logical inverter (IL1) at the control terminal of the second by-pass transistor (M9), short-circuiting it. The second by-pass transistor (M9) takes a value equal to the threshold value (Vtp) of a PMOS transistor at level 0 from the trigger signal ATD_left, thus performing a medium threshold selection.

The first by-pass transistor (M8) is thus also short-circuited, but a weak current continues to flow through it, which keeps the pull-up transistor (M1) weakly active.

In fact, the first by-pass transistor (M8) attenuates the voltage drop across the first decoupling transistor (M6) to high voltages. In this manner, the current passing through the pull-up transistor (M1) is reduced. The first by-pass transistor (M8) also has a variable impedance value, in particular greater at high voltages, thus behaving like a voltage follower.

In the presence of a pulse from a switching at the input terminals, trigger signal ATD_left is brought to a 0 level, turning the second by-pass transistor (M9) on.

The leakage transistor (M14) is a "leaker" transistor: it is always conducting and a moderate current passes through it.

To overcome the slowness of the leakage transistor (M14), the ATD pulse generating circuit (1) according to the invention includes advantageously the first (M10) and the second (M11) polarization transistors. These polarization transistors, in the presence of level 0 on the trigger signal ATD_left, rapidly bring it to a little more than 2Vtp, double the threshold value of a PMOS transistor, the control terminal of the pull-up transistor (M1).

In this manner, the overdrive of the pull-up transistor (M1) is increased appropriately, which draws more current, accelerating the trigger signal ATD_left.

In addition, the first logical inverter (IL1) used in the polarization structure (6) has a suitably low trigger threshold, so as to assure the descent of the first trigger signal ATD_left to activate the current through the first (M10) and the second (M11) polarization transistor.

Advantageously, according to the invention, the weak current passing through the pull-up transistor (M1) permits even the "dirty" pulses present on the left ATD bus (5) to be captured, while the succeeding high conductivity assures a rapid output transition with characteristics of a very irregular pulse.

The presence of the cascode transistor (M2) allows one to avoid a complete deviation of the excitation structure (8), which is highly capacitive.

If fact, the greater the current passing through the excitation structure (8) is, the worse the response is to distant pulses that do not succeed in making the trigger signal ATD_left rise sufficiently. Advantageously, according to the invention, it is possible to capture such pulses, the conductivity of the pull-up transistor (M1) being low.

In addition, the increase in the current passing through this transistor accelerates the production of ATD pulses by the ATD pulse generator circuit (1), in particular the ATDx pulse signal present at the first output terminal (O3) of the ATD generator (4).

The ATDn negative signal is obtained, in contrast, by using inside the ATD generator (4) a CMOS pass-gate (PG), connected to the supply-voltage reference (Vdd) by means of the decoupling transistor (M20).

In the presence of a level 1 for the pulse signal ATDx, the negative signal ATDn goes immediately to a level 0 by means of the CMOS pass-gate (PG), which imposes this level 0 until the pulse signal ATDx also goes to level 0. At this point, in fact, the logical delay gate (PL2) of the delay line (10) reactivates the CMOS pass-gate (PG), which forces the negative signal ATDn present at the second output terminal (O4) of the ATD generator (4) to a level 1.

The delay line (10) is therefore of an asymmetric type, transmitting a switching of the pulse signal ATDx from level 0 to level 1 instantaneously and a switching of the same signal ATDx from level 1 to level 0 with delay.

Advantageously, the ATD pulse generating circuit (1) according to the invention permits a signal ATDx of the pulse type to be obtained that is equal to a negative signal ATDn of the clock type.

In conclusion, the ATD pulse generating circuit (1) has the following advantageous characteristics:

- simplification of a large part of the ATD pulse generating circuit (1) by using transistors of the NMOS type to generate the excitation signals;
- absence of delays due to a possible tree structure;
- absence of current consumption under conditions of rest and reduced current consumption under operating conditions;

improvement in service by means of subdividing the circuit into a left (2) and a right (2') section, connected respectively to a left (5) and a right (5') ATD bus through a cascode line (7) having suitably limited deviations, in order not to increase the conductivity at high voltages excessively, avoiding a possible saturation phenomena, defusing the excitation structure (8);

modulated limiting conductivity of pull-up transistors M1 and M1', specifically minimal under conditions of rest, being coupled to a value equal to the threshold voltage (Vtp) of a PMOS transistor, and compensated at high voltages in such a way as to facilitate the capture of address transitions, and maximal at the end of a pulse from the trigger signals ATD_left and ATD_right, being coupled to a value equal to twice the threshold voltage (2Vtp) of a PMOS transistor, in such a way as to improve the interception speed from the end of such transitions, although compensated with respect to the supply-voltage reference (Vdd) thanks to the reduced correction by means of these threshold voltages (2Vtp) by better homogeneity of the ATD pulse obtained under diverse operating conditions;

obtaining a rapid and narrow pulse signal ATDx and a second, negative signal ATDn with rapid leading edges and increased duration with respect to the pulse signal ATDx through having characteristics of a clock signal that can be used under suitable operating conditions;

generation of correct polarization voltages at the cascode transistors (M2 and M2'), as well as at the leakage transistors (M14 and M14') by the reference-voltage generator (3), with consequent improvement in the dynamics of the ATD pulse generating circuit (1) as a whole.

I claim:

1. A generating circuit for synchronization signals to regulate a read phase of memory cells in electronic devices with integrated memory on a semiconductor of the type controlled by a switching in logical state on a left ATD bus and a right ATD bus, the generating circuit comprising:

a left and a right section inserted between a first and a second voltage reference, and connected respectively to said left and right ATD buses, each of said sections having an input coupled to a reference-voltage generator and an output coupled to an ATD generator, wherein each of said sections includes a pull-up transistor inserted between the first voltage reference and a first internal circuit node and having a control terminal connected to a polarization structure suitable for modulating the conductivity of the pull-up transistors, intentionally reducing it in a coupling phase to assure capture of all transitions on the left and right ATD buses, and increasing it in an operating phase, to follow precisely events of the transition, guiding the read phase in a timely manner.

2. A generating circuit for synchronization signals according to claim 1, wherein the ATD generator has a first and a second input terminal, connected respectively to the left and right sections, and a first and a second output terminal, which respectively provide a pulse signal and a negative signal of a clock type.

3. A generating circuit for synchronization signals according to claim 1, wherein each of said sections includes a cascode transistor, inserted between the first internal circuit node and a second internal circuit node and having a control terminal connected to a cascode line, on which a cascode voltage is present, having suitable limited deviations to interrupt connections to an excitation structure included in each of the left and right sections and inserted between the second internal circuit node and the second voltage reference.

4. A generating circuit for synchronization signals according to claim 3, wherein the reference-voltage generator provides the cascode voltage and a voltage reference, suitably less than said cascode voltage, at a first and a second output terminal.

5. A generating circuit for synchronization signals according to claim 4, wherein the polarization structure has a first input terminal connected to the first internal circuit node at which a trigger signal is present, a second input terminal that receives an enabling signal, which is the negative of an enabling signal of the reference-voltage generator, a third input terminal connected to the first output terminal of the reference-voltage generator, which receives the reference voltage, and an output terminal, which provides a polarization voltage and is connected to the control terminal of the pull-up transistor to modulate its conductivity.

6. A generating circuit for synchronization signals according to claim 5, wherein the polarization structure includes a first and a second by-pass transistor, inserted in parallel to each other between a third and a fourth internal circuit node and having their control terminals connected respectively to the third and the first input terminals of the polarization structure by means of a first logical inverter, said first by-pass transistor having a variable impedance value suitably lower than the cascode voltage, in order to keep said first by-pass transistor turned on, said second by-pass transistor decreasing the level of the trigger signal present at the first internal circuit node and therefore performing a medium threshold selection.

7. A generating circuit for synchronization signals according to claim 6, wherein the polarization structure also includes a leakage transistor inserted between the output terminal and the second voltage reference and having its control terminal connected to the first voltage reference, said leakage transistor being suitably resistive in order to establish a small current flow that polarizes the control terminal of the pull-up transistor.

8. A generating circuit for synchronization signals according to claim 7, wherein the polarization structure also includes a first decoupling transistor, configured as a diode and inserted between the third internal circuit node and the fourth internal circuit node, connected to the first by-pass transistor that attenuates its voltage drop at high voltages, thus decreasing the current drawn by the leakage transistor and therefore the current that passes through the pull-up transistor.

9. A generating circuit for synchronization signals according to claim 8, wherein the polarization structure also includes a first polarization transistor inserted between the output terminal and a fifth internal circuit node, and having the control terminal connected to the first input terminal of the polarization structure by means of the first logical inverter and a second polarization transistor inserted between the fifth internal circuit node and the second voltage reference and having its control terminal connected to the third input terminal of the polarization structure, said first and second polarization transistors bringing the first control terminal of the pull-up transistor rapidly to a first logic level in the presence of this first logic level on the trigger signal present at the first internal circuit node and said first logical inverter having a sufficiently low tripping threshold so as to assure the descent of the trigger signal present on the first internal circuit node before activation of a path through the first and the second polarization transistor.

10. A generating circuit for synchronization signals according to claim 2, wherein the ATD generator includes a logical input gate inserted between the input terminals and the first output terminal, connected in turn both to the second output terminal by means of a delay line, in series with a transistor of the CMOS pass-gate type and to an output logical inverter.

11. A generator circuit for synchronization signals according to claim 10, characterized by the fact that wherein the delay line includes a first delay logical inverter connected to the first output terminal and to a second delay logical inverter, as well as to control terminals of a decoupling transistor inserted between the first voltage reference and the CMOS pass-gate, said delay line also including a delay logic gate, having a first input terminal connected to the second delay logical inverter, a second input terminal connected to the CMOS pass-gate and an output terminal connected to a third delay logical inverter and to the CMOS pass-gate and therefore being of the asymmetric type, transmitting the switching of a pulse signal at the first output terminal from a first logic level to a second logic level instantaneously and the switching from the second logic level to the first logic level of the same signal with a delay.

12. A generating circuit for synchronization signals according to claim 4, further comprising a global enabling transistor inserted between the cascode line and the second voltage reference and receiving at its control terminal a global disabling signal for the circuit.

13. A generating circuit for generating a synchronization signal to regulate a read phase of a memory device controlled by a switching in logical state on a left ATD bus and a right ATD bus, the generating circuit comprising:

a left circuit section coupled between first and second voltage references and connected to the left ATD bus, the left circuit section having a left input coupled to a reference-voltage generator, a left output, a left pull-up transistor coupled between the first voltage reference and the left output and having a control terminal, and a left polarization structure coupled to the control terminal, the left polarization structure being structured to cause the left pull-up transistor to have a first conductance in a coupling phase and a second, increased conductance in an operating phase; and a right circuit section coupled between first and second voltage references and connected to the right ATD bus, the right circuit section having a right input coupled to a reference-voltage generator, a right output, a right pull-up transistor coupled between the first voltage reference and the right output and having a control terminal, and a right polarization structure coupled to the control terminal, the right polarization structure being structured to cause the right pull-up transistor to have a first conductance in a coupling phase and a second, increased conductance in an operating phase.

14. The generating circuit of claim 13, further comprising:

an ATD generator having a first input terminal coupled to the left output, a second input terminal coupled to the right output, a first output terminal at which a pulse signal is produced, and a second output terminal at which an inverted clock signal is produced having a level opposite to a level of the pulse signal.

15. The generating circuit of claim 14 wherein the ATD generator includes:

a logical input gate coupled between the input terminals and the first output terminal;

a delay line connected to the first output terminal and having a delay line output;

a pass gate connected to the first output terminal and having a control terminal coupled to the delay line output; and an output logical inverter connected between the pass gate and the second output terminal to produce the inverted clock signal at the second output terminal.

16. The generating circuit of claim 13 wherein the left section includes:

a left excitation structure coupled to the left ATD bus; and a cascode transistor coupled between the left output and the left excitation structure and having a control terminal connected to a cascode line on which a cascode voltage is present, the cascode voltage having suitable limited deviations to electrically interrupt the excitation structure from the left output.

17. The generating circuit of claim 16 wherein the reference-voltage generator includes first and second output terminals and is structured to provide the cascode voltage and a voltage reference, suitably less than said cascode voltage, at the first and second output terminals, respectively.

18. The generating circuit of claim 13 wherein the left polarization structure has a first input terminal connected to the left output, a second input terminal that receives an enabling signal that is opposite to an enabling signal received by the reference-voltage generator, a third input terminal connected to the reference-voltage generator to receive a reference voltage, and an output terminal, which provides a polarization voltage and is connected to the control terminal of the left pull-up transistor to modulate its conductivity.

19. A method for generating a synchronization-signal to regulate a read phase of memory cells in electronic devices with integrated memory on a semiconductor, the method comprising:

detecting a switching of a logical state on a left ATD bus and a right ATD bus connected respectively to a left section and a right section of a generating circuit for synchronization signals;

modulating conductivity of a left pull-up transistor included in said left section of the generating circuit, said conductivity being intentionally reduced in a coupling phase, to assure capture of all transitions on the left ATD bus and increased in an operating phase to follow with precision events of each of the transitions;

modulating conductivity of a right pull-up transistor included in said right section of the generating circuit, said conductivity being intentionally reduced in the coupling phase, to assure capture of all transitions on the right ATD bus and increased in the operating phase to follow with precision events of each of the transitions on the right ATD bus, thereby guiding the read phase in a timely manner.

20. A method for generating a synchronization signal of a clock type to regulate a read phase of memory cells in electronic devices with integrated memory on a semiconductor, the method comprising generating a pulse at a first logic level on a first output terminal of an ATD generator in response to detecting a switching of a logical state on at least a left ATD bus and a right ATD bus;

transmitted the pulse through a delay line provided between the first output terminal and a second output terminal of the ATD generator, said delay line being of an asymmetric type; and switching the pulse from the first logic level to a second logic level to produce the clock-type synchronization signal having duration determined by the delay line.

* * * * *